United States Patent [19]
Shibano

[11] Patent Number: 4,874,323
[45] Date of Patent: Oct. 17, 1989

[54] CONNECTOR

[75] Inventor: Yasuji Shibano, Izumisano, Japan

[73] Assignee: Brother Kogyo Kabushiki Kaisha, Nagoya, Japan

[21] Appl. No.: 264,037

[22] Filed: Oct. 28, 1988

[30] Foreign Application Priority Data

Nov. 11, 1987 [JP] Japan .............................. 62-172107[U]

[51] Int. Cl.⁴ ............................................. H01R 9/09
[52] U.S. Cl. ................................................... 439/260
[58] Field of Search ............... 439/260, 267, 261, 259, 439/326, 341

[56] References Cited

U.S. PATENT DOCUMENTS

| 4,054,742 | 10/1977 | Bonhomme | 439/260 |
| 4,735,578 | 4/1988 | Reichardt et al. | 439/260 |

FOREIGN PATENT DOCUMENTS

| 587539 | 7/1978 | U.S.S.R. | 439/260 |
| 82/01280 | 4/1982 | World Int. Prop. O. | 439/260 |

Primary Examiner—Gary F. Paumen
Attorney, Agent, or Firm—Jones, Tullar & Cooper

[57] ABSTRACT

The present invention discloses a connector in which, when a card C is inserted into a connector body 1, a resettable slider 5 disposed in the connector body 1 is moved from an advance position to a retreat position, such that one swing end(s) 26 of a swing member 4 in the connector body 1 is a pushed and displaced in a direction away from contact pieces 14, 15 disposed in the connector body 1, while the other swing end(s) 27 is displaced in a direction toward the contact pieces 14, 15. The displacement of the other swing end(s) 27 in a direction toward the contact pieces 14, 15 causes the card C to be moved in a direction toward the contact pieces 14, 15, such that the terminals of the card C come in contact with contact portions 14c, 15c of the contact pieces 14, 15. Thus, the contact of the terminals of the card C with the contact portions 14c, 15c of the contact pieces 14, 15 is minimized at the time when the card C is inserted and removed.

5 Claims, 11 Drawing Sheets

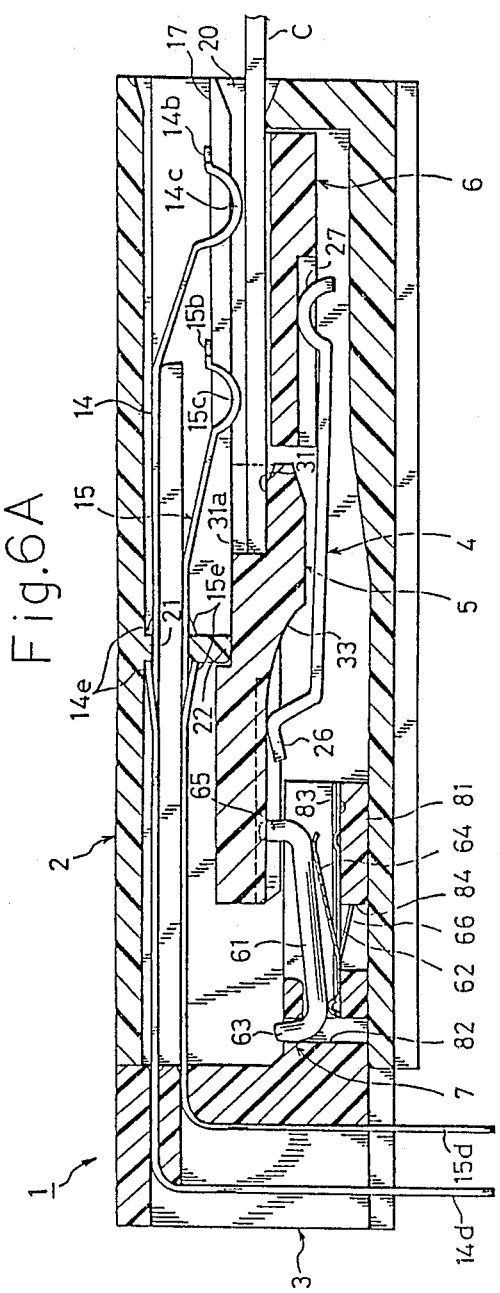

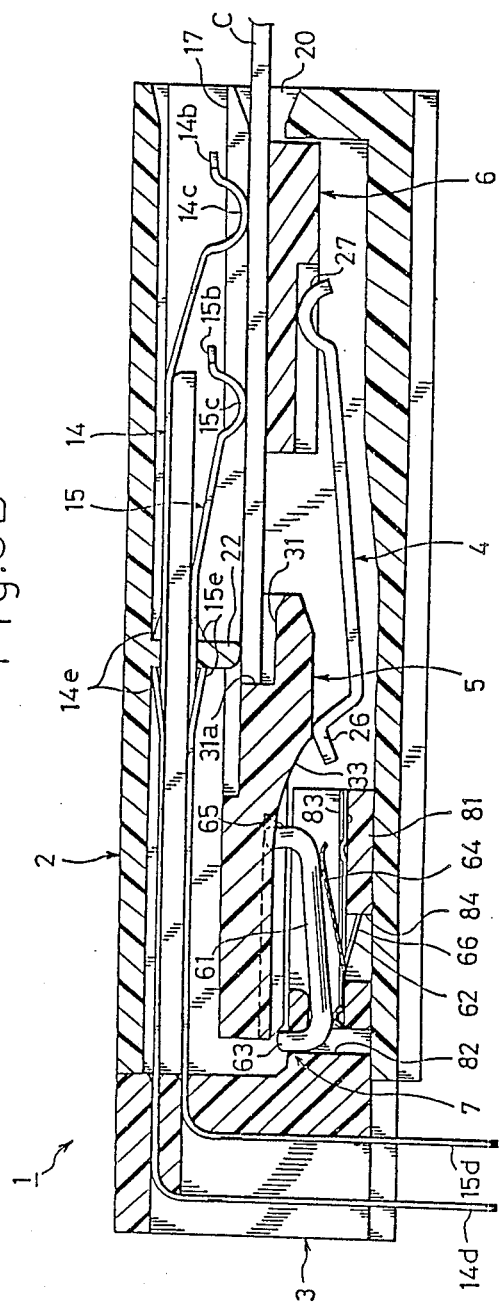

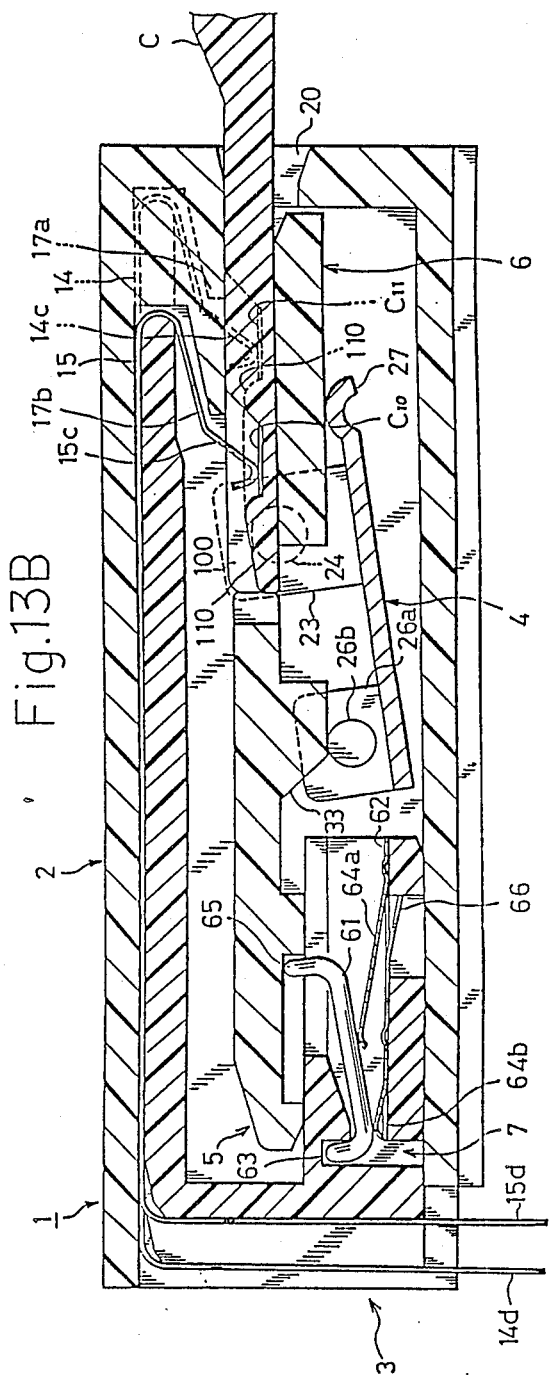

CONNECTOR

BACKGROUND OF THE INVENTION

1. Field of the Invention

The present invention relates to a connector to be used for electrically conducting the external terminals of a ROM card or the like, to the main body of an apparatus provided with a computer.

2. Description of the Prior Art

In a conventional connector of the type above-mentioned, the contact portions of contact pieces adapted to come in contact with the external terminals of a ROM card, project into a card inserting/removing passage in the connector body. When the card is inserted into and removed from the card inserting/removing passage, the contact portions above-mentioned are adapted to resiliently rub against the surface or external terminals of the card. When the card is set in the connector body at a predetermined position thereof, the contact portions are adapted to resiliently come in contact with the external terminals of the card under a predetermined force.

To achieve a reliable electric conduction, the contact pressure of the contact portions to the card external terminals may be increased. In this case, however, when the card is inserted and removed, the rubbing force of the contact portions against the card and its external terminals is also increased This not only produces remarkable wear in the contact portions and the card external terminals, but also requires a great operating force for inserting and removing the card.

On the contrary, to improve the maneuverability with a small operating force required, the rubbing force of the contact portions against the card or its external terminals may be reduced. This reduces the contact pressure of the contact portions to the external terminals of the card set in the connector body at a predetermined position. This involves the likelihood that the electric conduction is not fully assured.

As apparent from the foregoing, such a connector has two requirements, i.e., (i) increase in the contact pressure of the contact portions to the external terminals of the card set in the connector body at a predetermined position thereof, thereby to assure electric conduction, and (ii) decrease in the operating force required for insertion and removal of the card, thereby to improve the maneuverability and to decrease the wear of the contact portions and the card external terminals.

In the conventional connector, these requirements are inconsistent with each other, and both requirements cannot be simultaneously satisfied.

SUMMARY OF THE INVENTION

It is an object of the present invention to provide a connector arranged such that, when inserting and removing a ROM card, the contact portions of the connector do not rub against the card, and when the card is set in the connector body at a predetermined position thereof, the external terminals of the card come in contact with the contact portions, thereby to assure a reliable electric conduction between the contact portions and the card external terminals, simultaneously with improvement in card inserting/removing maneuverability.

To achieve the object above-mentioned, the connector in accordance with the present invention comprises:

a connector body provided in the front side thereof with a card inserting/removing port;

contact pieces disposed, at predetermined spatial intervals, in the inner part of the card inserting/removing port in the connector body;

a resettable slider in the connector body adapted to be pushed and moved from an advance position to a retreat position by a card inserted through the card inserting-/removing port; and a swing member disposed at the opposite side of the slider to the side thereof on which the contact pieces are disposed, and extending over the slider and the card inserted through the card inserting/removing port, the swing member being supported by the connector body in a manner swingable around the axis of the swing member at a right angle to a card inserting/removing direction.

According to the connector of the present invention, as the slider is moved from the advance position to the retreat position, one swing end(s) of the swing member is pushed by the slider and displaced in a direction away from the contact pieces, and the other swing end(s) of the swing member is displaced in a direction toward the contact pieces. This causes a card inserted through the card inserting/removing port to be moved in a direction toward the contact pieces, such that the terminals of the card come in contact with contact portions of the contact pieces.

BRIEF DESCRIPTION OF THE DRAWINGS

Other features and advantages of the invention will become apparent from the following description of a preferred embodiment of the invention given in conjunction with the accompanying drawings wherein:

FIG. 6A is a section view of the connector in FIG. 1, illustrating an initial state where a card is inserted into the connector body;

FIG. 6B is a view similar to FIG. 6A, but illustrates a state where the card inserted into the connector body is set at a predetermined position therein;

FIG. 13B is a section view of the connector in FIG. 12, illustrating a state where the card inserted into the connector body is set at a predetermined position there.

DETAILED DESCRIPTION OF THE PREFERRED EMBODIMENTS

Figure 1:
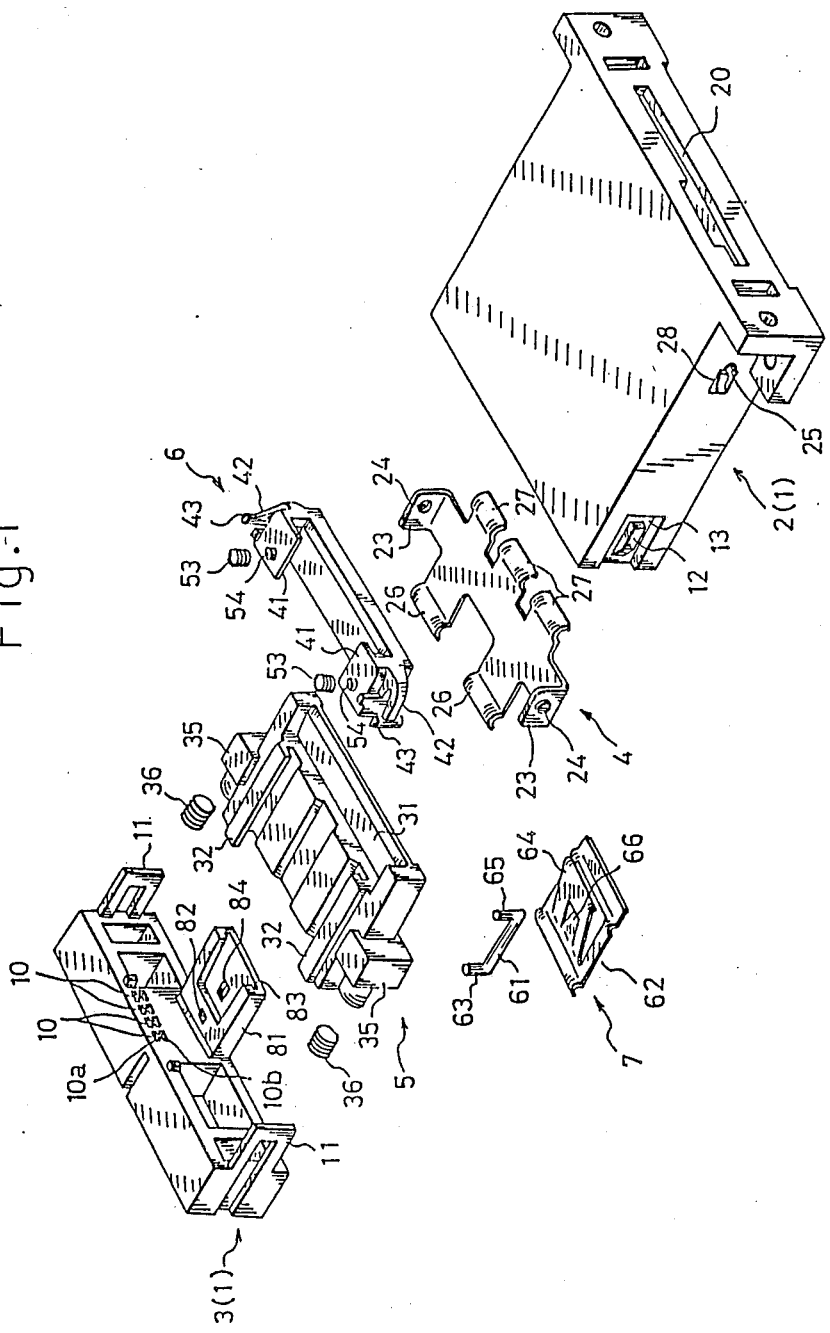
FIG. 1 is a perspective exploded view of a connector in accordance with a first embodiment of the present invention.

In FIG. 1 to FIG. 6A and FIG. 6B, the connector in accordance with the present invention includes; a connector body 1 made of resin divided into a main body 2 and a rear cover 3; a swing member 4; a slider 5 made of resin; an actuator 6 made of resin; and a lock mechanism 7.

Figure 4:
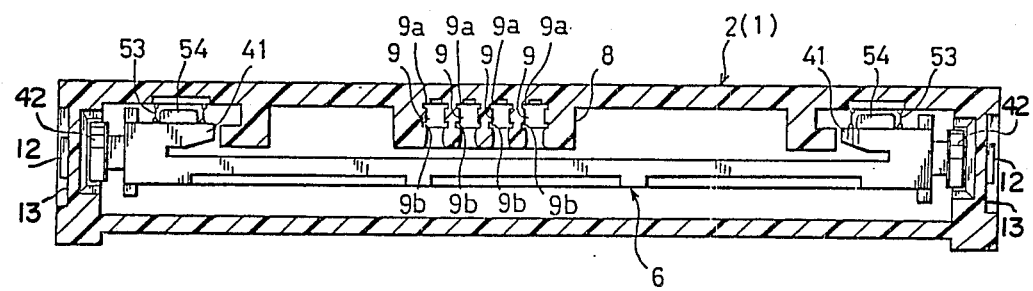
FIG. 4 is a section view taken along the line IV—IV in FIG. 2.
Figure 5:
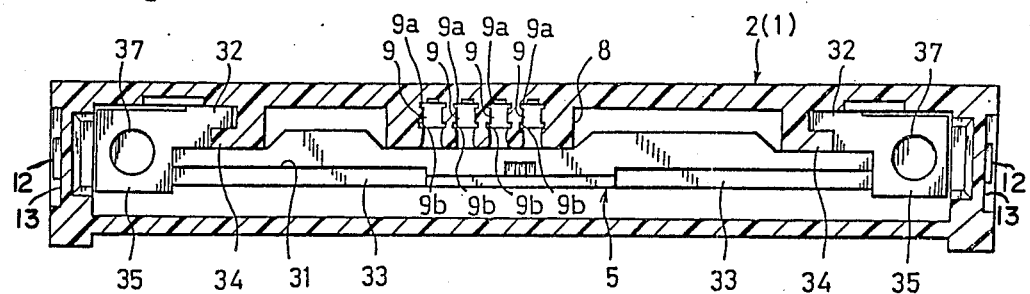
FIG. 5 is a section view taken along the line V—V in FIG. 2.

The main body 2 is provided, at the inner side of the center of the upper wall thereof, with a thick portion 8 as shown in FIG. 4 and FIG. 5. Four contact piece insertion holes 9 are defined in this thick portion 8. Formed in each of the contact piece insertion holes 9 are contact pieces insertion grooves 9a, 9b vertically separated from each other.

As shown in FIG. 1, the rear cover 3 is provided at the center thereof with four contact piece insertion holes 10, each having upper and lower contact piece insertion grooves 10a, 10b. When the rear cover 3 is assembled with the main body 2, the contact piece insertion holes 9 and the contact piece insertion grooves 9a, 9b are adapted to communicate with the contact piece insertion holes 10 and the contact piece insertion grooves 10a, 10b, respectively.

The rear cover 3 is provided, at both lateral walls thereof, with forward projecting engagement pieces 11. The main body 2 is provided, at the rear ends of both lateral walls thereof, with portions to be engaged 12. The rear cover 3 is assembled with the main body 2 by engaging the engagement pieces 11 of the rear cover 3 with the portions to be engaged 12 of the main body 2. It is noted that the engagement pieces 11 are fitted into concave grooves 13 formed in the main body 2.

Figure 2:
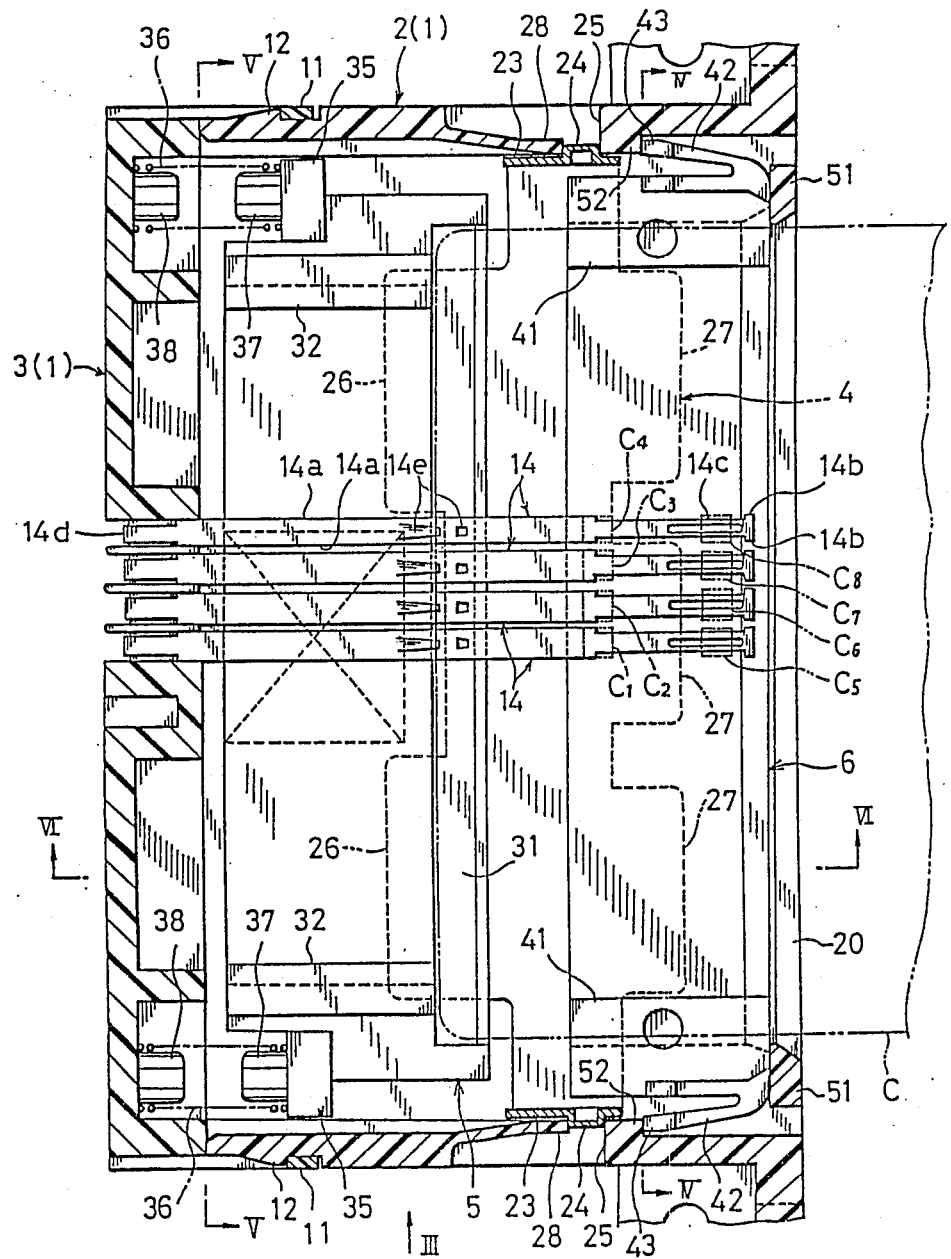
FIG. 2 is a transverse section view of the connector in FIG. 1.

In FIG. 2 and FIG. 6A, long contact pieces are generally designated by a reference numeral 14. In FIG. 6A, short contact pieces are generally designated by a reference numeral 15. The long contact pieces 14 are provided at the tips thereof with curved contact portions 14c. The intermediate portions of the long contact pieces 14 are made wider than other portions thereof. The intermediate wider portions 14a are inserted into the upper contact piece insertion grooves 9a, 10a of the contact piece insertion holes 9, 10. As presumed from FIG. 6A, the tip projecting portions 14b are resiliently hooked, from above, on ribs 17 of the main body 2 such that a pre-load is applied to the contact portions 14c. The long contact pieces 14 are inserted into the contact piece insertion grooves 9a, 10a through a card inserting-/removing port 20 formed in the main body 2 at the front side thereof. After the long contact pieces 14 have been inserted, lead portions 14d thereof are turned downward, causing the lead portions 14d to project downward from the rear cover 3.

The foregoing is also applied to the short contact pieces 15. A pre-load is applied to the contact portions 15c. The short contact pieces 15 have lead portions 15d.

The card inserting/removing port 20 has a height slightly greater than the thickness of a card C. When inserted into the card inserting/removing port 20, the card C may be vertically movable slightly. The long contact pieces 14 and the short contact pieces 15 are provided at the centers thereof with cut-raised claws 14e, 15e, respectively. These cut-raised claws 14e, 15e are engaged with engagement portions 21, 22 of the main body 2, thereby to prevent the contact pieces 14, 15 from coming off from the main body 2.

The swing member 4 is made of a metallic plate punched into a predetermined shape and has a great rigidity. The swing member 4 is provided at the transverse ends thereof with upwardly turned portions 23 having outwardly turned projections 24. The swing member 4 is fitted in the main body 2 and the outwardly turned projections 24 are supported by supporting holes 25 formed in both lateral walls of the main body 2. Accordingly, the swing member 4 is swingable around its axis passing through the supporting holes 25. This axis passing through the supporting holes 25 is at right angle to an inserting/removing direction of the card C. The swing member 4 has swing ends 26 and swing ends 27, respectively located at the rear side and the forward side with respect to the axis above-mentioned. The swing ends 26, 27 may be upwardly curved as shown in FIG. 1, or may be made in the form of a mountain (not shown).

Figure 3:
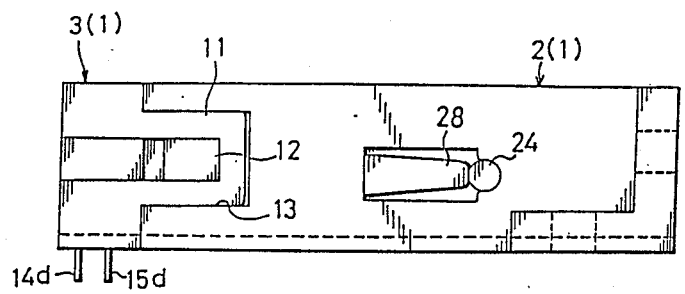
FIG. 3 is a view taken from the arrow III in FIG. 2.

As shown in FIG. 2 and FIG. 3, the main body 2 is provided with tongue pieces 28 opposite to the supporting holes 25. Accordingly, when the swing member 4 is gradually pushed from the rear side of the main body 2, the projections 24 are adapted to be fitted in the supporting holes 25 at the time when the turned portions 23 of the swing member 4 ride across the tongue pieces 28 while the tongue pieces 28 and the turned portions 23 are resiliently deformed. This arrangement presents the advantage that the swing member 4 is securely supported by the main body 2 in a stable manner, without requirements of high precision as to the distance between the tongue pieces 28 or the distance between the turned portions 23 of the swing member 4.

The slider 5 is provided at the front end thereof with a concave 31 of which top and front surfaces are opened. The slider 5 is also provided at both ends of the top thereof with hook-like engagement portions 32. As shown in FIG. 6A, the slider 5 is provided at the underside thereof with two cam surfaces 33 which are gradually lowered in a direction toward the front end of the slider 5. The cam surfaces 33 are respectively formed at the left- and right-hand sides of the slider 5. The slider 5 is held in the main body 2 in a manner slidable in a front-to-back direction by fitting, as shown in FIG. 5, the engagement portions 32 of the slider 5 into guide portions 34 which are formed in the main body 2 and have an L-shape section and a reverse L-shape section, respectively. As shown in FIG. 2 and FIG. 5, the slider 5 is provided at both ends thereof with spring lock washers 35. Coil springs 36 are disposed between the washers 35 and the rear cover 3. The slider 5 is biased normally forward by the coil springs 36 in a resettable manner. Also, the slider 5 is provided with spring holding projections 37, and the rear cover 3 is provided with spring holding projections 38. The advance position of the slider 5 is regulated by an engagement portion 22 formed in the main body 2.

The actuator 6 is provided at both ends thereof with hook-shape projections 41 and engagement pieces 42 which extend inclinedly backward from both end surfaces of the actuator 6. The engagement pieces 42 are provided at the tips thereof with vertically projecting guide portions 43. The main body 2 is provided at the front end thereof with left- and right-hand supports 51. Stepped portions 52 are opposite to the supports 51. The engagement pieces 42 of the actuator 6 are fitted between the supports 51 and the stepped portions 52, as shown in FIG. 2. The front end surfaces of both ends of the actuator 6 are vertically slidably supported by the supports 51. The guide portions 43 are vertically slidably supported by the stepped portions 52. Thus, the actuator 6 is fitted in the main body 2. For assembling the actuator 6 in the main body 2, the actuator 6 is fitted in the main body 2 from the rear side thereof, causing the engagement pieces 42 to ride across the stepped portions 52 while the engagement pieces 42 are resiliently deformed.

As shown in FIG. 4, the coil springs 53 are disposed between the projections 41 of the actuator 6 and the upper wall of the main body 2. As shown in FIG. 6A and FIG. 6B, the lower surface of the actuator 6 normally biased downward by the coil springs 53 are supported by the other swing ends 27 of the swing member 4. Accordingly, the swing ends 26 of the swing member 4 are biased upward by the coil springs 53, causing the swing ends 26 to follow the cam surfaces 33 of the slider 5. As shown in FIG. 1, the actuator 6 has spring holding projections 54.

The lock mechanism 7 is a so-called heart cam mechanism including a pin 61, a spring plate 62 and a guide groove 70 (to be discussed later) formed in the underside of the slider 5. As shown in FIG. 2, FIG. 6A and FIG. 6B, the lock mechanism 7 is disposed between the body 1 and the slider 6.

More specifically, the pin 61 is provided at the base side thereof with an upwardly turned portion 63. As shown in FIG. 6A and FIG. 6B, this turned portion 63 is inserted in and held by a square hole 82 formed in a projection 81 of the rear cover 3. The spring plate 62 is held by grooves 83 formed in the projection 81. The pin 61 has an upwardly turned portion 65 which is upwardly biased by a tongue piece 64 of the spring plate 62. This upwardly turned portion 65 is inserted into the guide groove 70 to be discussed later. By a claw 66, the spring plate 62 is hooked in an engagement hole 84 formed in the projection 81.

Figure 7A:
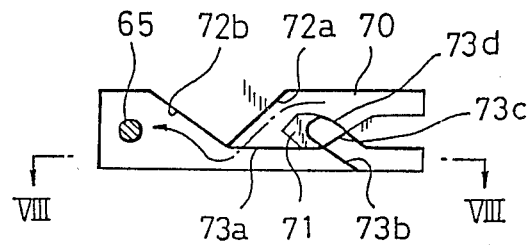
FIG. 7A to FIG. 7C are views of one example of a lock mechanism for locking and unlocking a resettable slider adapted to be moved as pushed by a card inserted into the connector body, and illustrate the operation of this lock mechanism.
Figure 7B:
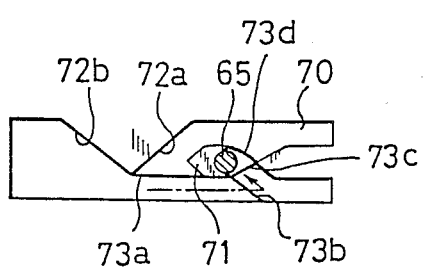
Figure 7C:
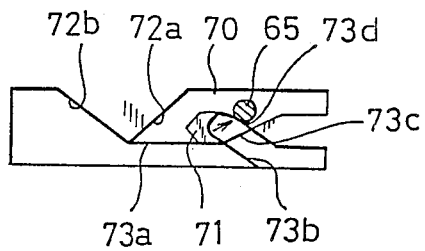
Figure 8:
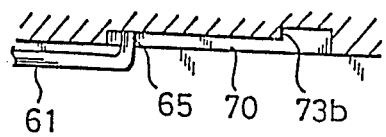
FIG. 8 is a section view taken along the line VIII—VIII in FIG. 7A.

FIG. 7A to FIG. 7C are views illustrating the operation of the lock mechanism 7, while FIG. 8 is an enlarged section view taken along the line VIII - VIII in FIG. 7A.

In FIG. 7A to FIG. 7C and FIG. 8, the guide groove 70 includes a heart-shape engagement portion 71, guide surfaces 72a, 72b forming a V-shape, and four stepped portions 73a, 73b, 73c and 73d. Under the action of these stepped portions 73a, 73b, 73c, 73d, the turned portion 65 of the pin 61 is guided in a specific one direction only. That is, the turned portion 65 is prevented from being relatively moved in the direction opposite to the specific one direction above-mentioned.

Figure 10:
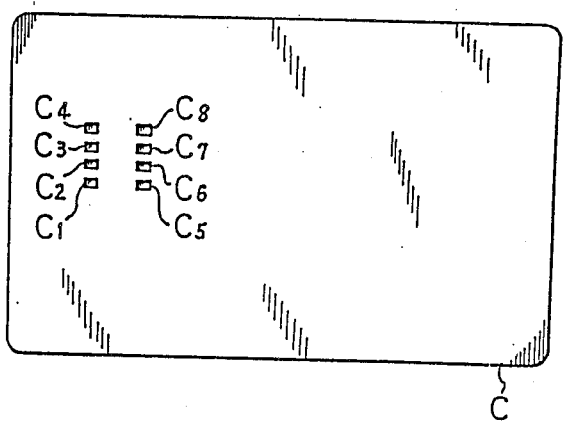
FIG. 10 is a plan view of an example of the card.

FIG. 10 shows an example of the card C, which has eight external terminals $C_1$ to $C_8$ in two rows in a front-to-back direction.

The following description will discuss the operation of the connector of the present invention.

In the inside of the connector body 1 constituted by the main body 2 and the rear cover 3, the card inserting-/removing passage is formed by a space between the projections 41 of the actuator 6 and by the concave 31 of the slider 5. Accordingly, the card C is adapted to be inserted in and removed from the card inserting/removing passage through the card inserting/removing port 20 in the main body 2.

When the card C is not being inserted into the inserting/removing passage, the actuator 6 is pushed down by the coil springs 53, and the slider 5 is pushed out by the coil springs 36. The contact portions 14c of the long contact pieces 14 and the contact portions 15c of the short contact pieces 15 are held at the positions regulated by the ribs 17 as shown in FIG. 6A. That is, the contact portions 14c and 15c are opposite to and spaced from the space between the projections 41 of the actuator 6, i.e, the card inserting/removing passage. Accordingly, even though the card C is inserted into the space between the projections 41 of the actuator 6 through the card inserting/removing port 20 in the main body 2, the contact portions 14c and 15c do not come in contact with the surface of external terminals $C_1$ to $C_8$ of the card C, as shown by a virtual line in FIG. 2 and by FIG. 6A.

When a rising surface 31a of the concave 31 of the slider 5 is pushed by the card C in the state shown in FIG. 6A, the slider 5 is pushed from the advance position in FIG. 6A to the retreat position in FIG. 6B against the spring loads of the coil springs 36. This causes the swing ends 26 of the swing member 4 to be gradually pushed down by the cam surfaces 33 of the slider 5. When the slider 5 arrives at the retreat position, the swing ends 26 are positioned at the lowest portions of the cam surfaces 33. This causes the other swing ends 27 of the swing member 4 to be gradually pushed up, contrary to gradual lowering of the swing ends 26. Thus, the swing ends 27 are displaced in a direction toward the contact portions 14c and 15c. By such action of the swing member 5, the actuator 6 is pushed up against the spring loads of the coil springs 53 and, at the same time, the card C is horizontally pushed down. This causes the external terminals $C_1$ to $C_8$ to be pressingly contacted with the corresponding contact portions 14c and 15c. This causes the contact portions 14c and 15c to be pushed up against the pre-loads of the contact pieces 14 and 15. Accordingly, the contact portions 14c and 15c come in contact with the external terminals $C_1$ to $C_8$ under a great contact pressure. This assures a reliable electric conduction.

It is immediately before the slider 5 fully reaches the retreat position, i.e., at a position immediately before the setting position of the card C that the external terminals $C_1$ to $C_8$ come in contact, for the first time, with the contact portions 14c and 15c. Therefore, the contact portions 14c and 15c slightly rub against the external terminals $C_1$ to $C_8$. However, such slight rubbing is rather advantageous in view of self-cleaning of the surfaces of the external terminals $C_1$ to $C_8$.

When the slider 5 is pushed in the manner above-mentioned, the turned portion 65 of the pin 61 in the lock mechanism 7 is displaced from the position in FIG. 7A to the position in FIG. 7B where the turned portion 65 is engaged with the engagement portion 71. Thus, the turned portion 65 is locked, causing the slider 5 to be held at the retreat position.

When pulling out the card C, the card C is slightly pushed in from the position in FIG. 6B. This causes the turned portion 65 of the pin 61 to be disengaged from the engagement portion 71, as shown in FIG. 7C. Accordingly, the slider 5 is pushed back from the retreat position to the advance position by the coil springs 36. This causes the turned portion 65 to be displaced from the position shown in FIG. 7C to the position shown in FIG. 7A. Also, the swing ends 26 of the swing member 4 get away from the cam surfaces 33, and the actuator 6 is horizontally lowered by the coil springs 53 as shown in FIG. 6A. This causes the external terminals $C_1$ to $C_8$ of the card C to be separated from the contact portions 14c and 15c. As pushed by the slider 5, the card C is pushed back through the card inserting/removing port 20. Then, the card C may be pulled out. The self-cleaning above-mentioned is instantaneously carried out also at the time when the external terminals $C_1$ to $C_8$ are separated from the contact portions 14c and 15c.

According to this embodiment, even though the card C has the external terminals $C_1$ to $C_8$ arranged in the card inserting/removing direction, there is no possibility of all external terminals $C_1$ to $C_8$ coming in contact with the contact portions 14c and 15c when the card C is inserted and removed. This presents the advantage that it is securely avoided that, when the card C is inserted and removed, a short-circuit takes place between the external terminals $C_1$ to $C_8$ and the contact portions 14c, 15c which are not corresponding to each other.

In this embodiment, through the actuator 6 the card C is horizontally pushed up such that the external terminals $C_1$ to $C_8$ come in contact with the contact portions 14c and 15c. However, if the card C has a sufficient rigidity, the actuator 6 is not always necessary. That is, the actuator 6 is disposed for supporting the card C such that no flexion or the like takes place in the card C. A card having a sufficient rigidity does not involve such danger of flexion or the like.

Figure 9:
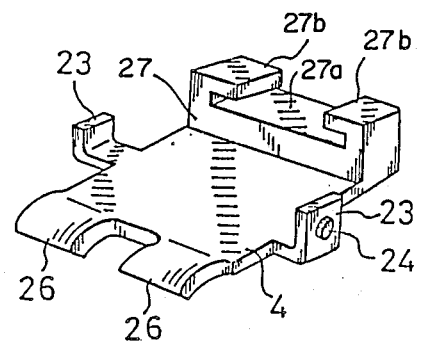
FIG. 9 is a perspective view of another example of a swing member used in the present invention.

Without the use of the actuator 6, for example a swing member 4 shown in FIG. 9 may be used. In FIG. 9, the other swing end 27 of the swing member 4 is provided with a support plate 27a for supporting the card C, the support plate 27a being formed integrally with the swing member 4. In this case, the swing end 27 may have projections 27b for guiding the card C to the slider 5.

The connector described in the foregoing uses the card C having the external terminals $C_1$ to $C_8$ which are flush with the surface of the card C. However, a card of the other type may also be used.

Figure 11:
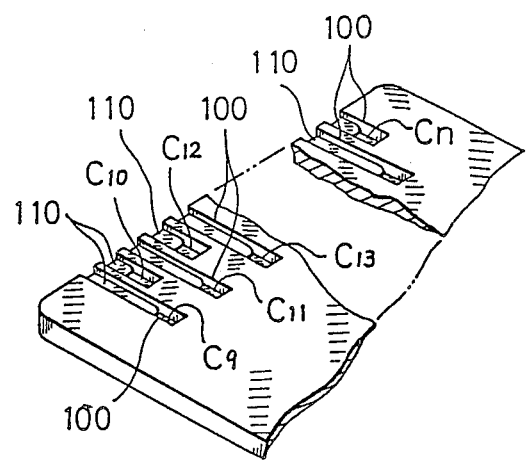
FIG. 11 is a perspective view of main portions of another example of the card.

FIG. 11 shows a card C of the type different from the card C in FIG. 10.

The card C in FIG. 11 has external terminals $C_9$ to $C_n$ which are housed in grooves 100 formed in the card C at the tip thereof. Such arrangement causes the external terminals $C_9$ to $C_n$ not to be easily touched with the hand. The grooves 100 are provided at the inlet portions thereof with expanded portions 110 (See FIG. 13A and 13B). In the connector for such card C, if the actuator 6 is vertically moved in a small range under the action of the swing member 4, the contact portions 14c and 15c may rub against the expanded portions 110 at the time when the card C is inserted and removed. This involves the likelihood that the contact portions 14c and 15c and the expanded portions 110 wear away prematurely. Since the card C is generally made of resin, the expanded portions 110 are susceptible to wear. It is therefore required in the connector for the card C in FIG. 11 that the actuator 6 is vertically movable in a great range. To increase the range of vertical movement of the actuator 6, provision may be made so as to increase the distance between the projections 24 serving as a fulcrum of the swing member 4 and the other swing end(s) 27. However, such arrangement is not preferable since the swing member 4 becomes large-scaled. Accordingly, it will be preferable to increase the gradient of the cam surfaces 33 of the slider 5.

Figure 12:
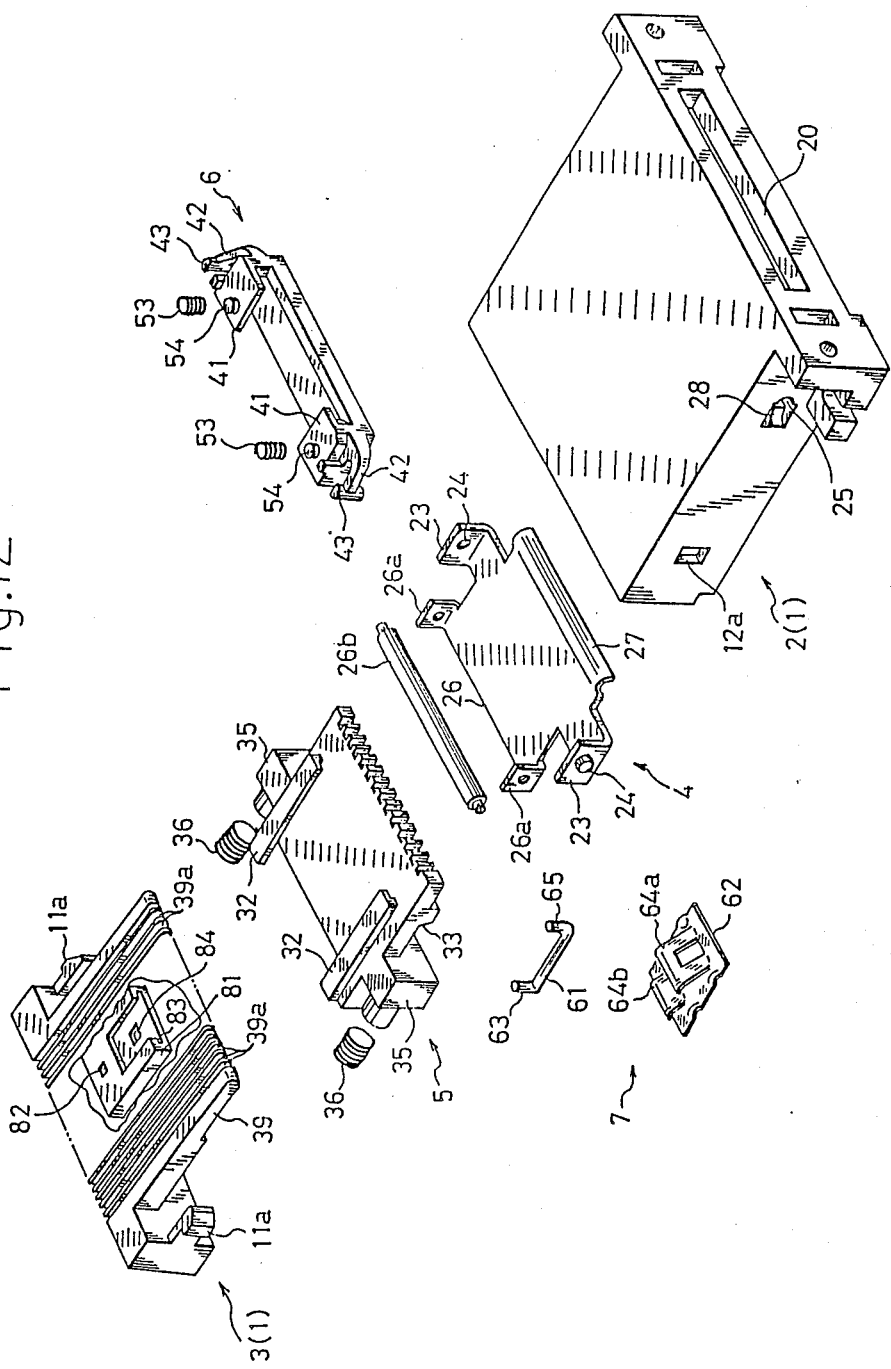
FIG. 12 is a perspective exploded view of a connector in accordance with a second embodiment of the present invention.

FIG. 12 is a perspective exploded view of a connector in which a slider 5 has sharp-gradient cam surfaces 33. The general arrangement of the connector in FIG. 12 is substantially the same as that of the connector shown in FIG. 1. The following description will therefore discuss only the different points between the connectors in FIG. 1 and FIG. 12.

A rear cover 3 has projections 39 in which a plurality of grooves 39a are formed for holding long and short contact pieces. The rear cover 3 is provided at both lateral walls thereof with forwardly projecting engagement pieces 11a. A main body 2 is provided at the rear sides of both lateral walls thereof with engagement holes 12a. By engaging the engagement pieces 11a with the engagement holes 12a, the rear cover 3 is fitted into the main body 2. The engagement pieces 11a are fitted in the inside of the main body 2.

A swing member 4 has one swing end 26 provided with brackets 26a. A roller 26b is rotatably supported by the brackets 26a. In a lock mechanism 7, a spring plate 62 has two tongue pieces 64a, 64b for biasing a pin 61 upward. The main body 2, a slider 5 and an actuator 6 have substantially the same arrangements as those of the connector shown in FIG. 1.

Figure 13A:
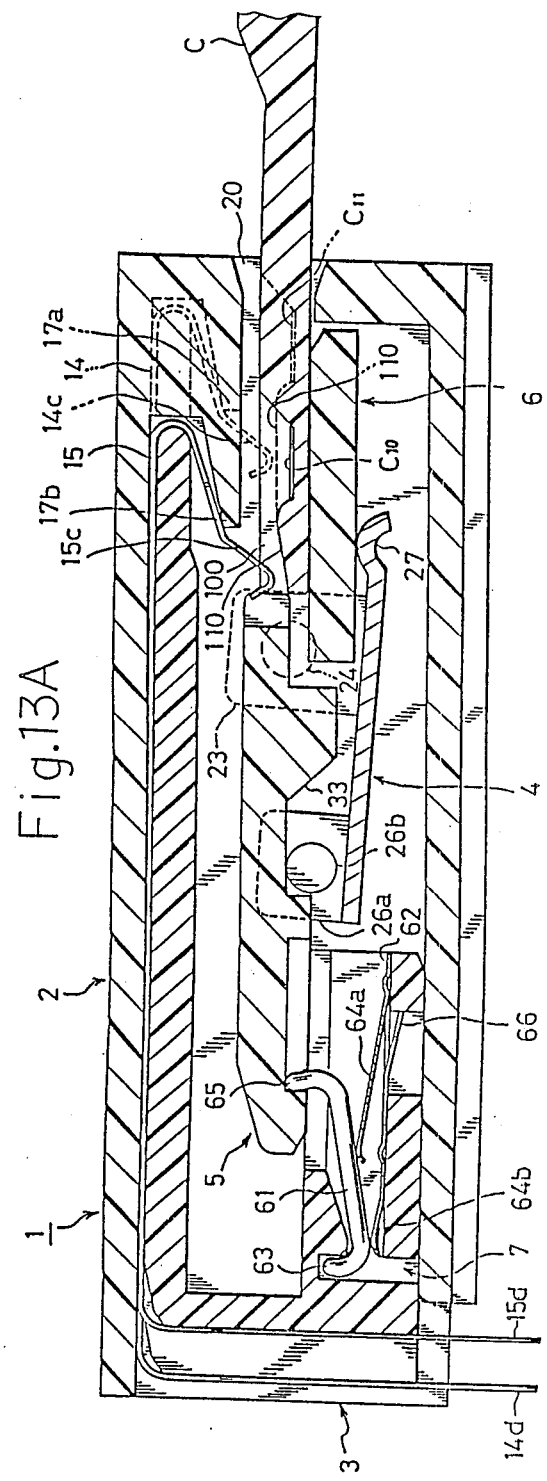
FIG. 13A is a section view of the connector in FIG. 12, illustrating an initial state where the card is inserted into the connector body.

FIG. 13A and 13B are views similar to FIGS. 6A and 6B. The following description will discuss the operation of the connector in FIG. 12 with reference to FIG. 12, FIG. 13A and 13B.

When the card C is not being inserted into a card inserting/removing passage formed by the actuator 6, the actuator 6 is pushed down by coil springs 53 and the slider 5 is pushed out by coil springs 36. As shown in FIG. 13A, contact portions 14c and 15c of long and short contact pieces 14 and 15 are held at positions regulated by ribs 17a, 17b of the main body 2. The contact portions 14c and 15c are opposite to and spaced from the card inserting/removing passage. Accordingly, even though the card C is inserted through a card inserting/removing port 20 in the main body 2 as shown in FIG. 13A, the contact portions 14c and 15c do not come in contact with the expanded portions 110 and the external terminals $C_9$ to $C_n$ of the card C.

When the slider 5 is pushed by the card C in the position shown in FIG. 13A, the slider 5 is pushed from the advance position in FIG. 13A to the retreat position in FIG. 13B against the spring loads of coil springs 36. As the slider 5 is pushed, the roller 26b at the one swing end 26 of the swing member 4 is gradually pushed down as rotated, by the cam surfaces 33 of the slider 5. When the slider 5 reaches the retreat position, the roller 26b is located at the lowest positions of the cam surfaces 33. The sharp gradients of the cam surfaces 33 cause the other swing end 27 of the swing member 4 to be considerably pushed up even through the slider 5 presents a short stroke. Consequently, the actuator 6 is considerably pushed up against the spring loads of the coil springs 53. Thus, the external terminals $C_9$ to $C_n$ of the card C are pressingly contacted with the corresponding contact portions 14c and 15c. Further, the roller 26b rotatingly follows the cam surfaces 33. This causes the swing member 4 to be smoothly swung even though the cam surfaces 33 are sharply inclined. When the slider 5 reaches the retreat position, the lock mechanism 7 takes a lock position.

When pulling out the card C, the card C is slightly pushed from the position in FIG. 13B. This causes the lock mechanism 7 to be released from the lock position. Then, the slider 5 is pushed out from the retreat position to the advance position by the coil springs 36. The roller 26b of the swing member 4 get away from the cam surfaces 33, and the actuator 6 is lowered by the coil springs 53 as shown in FIG. 13A. Accordingly, the external terminals $C_9$ to $C_n$ of the card C are separated from the contact portions 14c and 15c, and the card C is pushed out through the card inserting/removing port 20 under the pushing action of the slider 5.

Other operational results obtained by the connector in FIG. 12 are the same as those achieved by the connector shown in FIGS. 1 to 8.

For simplification of the description, there has been omitted a detailed description of the connector of the second embodiment with reference to FIG. 12 and FIG. 13A and 13B, in which like parts are designated by like reference numerals used in FIG. 1 and FIG. 6A and 6B.

What is claimed is:

1. A connector comprising:
    A connector body provided in the front side thereof with a card inserting/removing port:
    contact pieces disposed, at predetermined spatial intervals, in the inner part of said card inserting-/removing port in said connector body;
    a resettable slider in said connector body adapted to be moved from an advance position to a retreat position by a card inserted through said card inserting/removing port; and
    a swing member disposed at the opposite side of said slider to the side thereof on which said contact pieces are disposed, and extending over said slider and a card inserted through said card inserting-/removing port, said swing member being supported by said connector body so as to be swingable around the axis of said swing member, said axis being at a right angle to a card inserting/removing direction,
    whereby, as said slider is moved from said advance position to said retreat position, one swing end of said swing member is pushed by said slider and displaced in a direction away from said contact pieces, and the other swing end of said swing member is displaced in a direction toward said contact pieces, causing the card inserted through said card inserting/removing port to be moved in a direction toward said contact pieces, such that the terminals of said card come in contact with contact portions of said contact pieces.

2. A connector as set forth in claim 1, wherein the slider has cam surfaces by which the one end of the swing member is gradually displaced in directions to and away from the contact pieces, said cam surfaces being formed at said opposite side of said slider.

3. A connector as set forth in claim 2, wherein the one swing end is provided with a roller adapted to be rotated along the cam surfaces.

4. A connector as set forth in claim 1, further comprising an actuator for supporting a card inserted through the card inserting/removing port, said actuator being disposed at the side of the other swing end on which the contact pieces are disposed and at the forwrd side of the slider, and wherein, through said actuator, a card inserted through said card inserting/removing port is horizontally moved in a direction toward said contact pieces, such that the terminals of said card come in contact with the contact portions of said contact pieces.

5. A connector as set forth in claim 1, wherein the other swing end has support plate for supporting a card inserted through the card inserting/removing port, said support plate being formed integrally with said other swing end, whereby the card inserted through said card inserting/removing port is horizontally moved in a direction toward the contact pieces such that the terminals of said card come in contact with the contact portions of said contact pieces.

* * * * *